(12) United States Patent
Colpani

(10) Patent No.: US 6,218,265 B1
(45) Date of Patent: *Apr. 17, 2001

(54) PROCESS FOR FABRICATING A SEMICONDUCTOR NON-VOLATILE MEMORY DEVICE WITH SHALLOW TRENCH ISOLATION (STI)

(75) Inventor: Paolo Colpani, Agrate Brianza (IT)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/336,089

(22) Filed: Jun. 18, 1999

(30) Foreign Application Priority Data

Jun. 30, 1998 (EP) .................................................. 98830388

(51) Int. Cl.[7] .......................... H01L 21/76; H01L 21/336; H01L 29/76; H01L 29/94
(52) U.S. Cl. .......................... 438/424; 438/433; 438/300; 257/332; 257/337; 257/390
(58) Field of Search .................................. 438/424, 433, 438/300; 257/331, 332, 337, 390, 315

(56) References Cited

U.S. PATENT DOCUMENTS

| | | | |
|---|---|---|---|
| 3,988,619 | * 10/1976 | Malaviya et al. | 307/311 |
| 4,258,466 | * 3/1981 | Kuo et al. | 29/571 |
| 4,905,062 | 2/1990 | Esquivel et al. | 357/23.5 |
| 5,021,355 | * 6/1991 | Dhong et al. | 437/35 |
| 5,025,494 | * 6/1991 | Gill et al. | 357/23.5 |
| 5,103,274 | 4/1992 | Tang et al. | 357/23.5 |
| 5,453,637 | 9/1995 | Fong-Chun et al. | 257/390 |
| 5,492,858 | * 2/1996 | Bose et al. | 437/67 |
| 5,578,519 | * 11/1996 | Cho | 437/67 |
| 5,679,599 | * 10/1997 | Mehta | 437/69 |
| 5,696,019 | * 12/1997 | Chang | 437/67 |

(List continued on next page.)

OTHER PUBLICATIONS

European Search Report from European Patent Application 98830388.9, filed Jun. 30, 1998.

*Primary Examiner*—Matthew Smith
*Assistant Examiner*—Lex H. Malsawma
(74) *Attorney, Agent, or Firm*—Wolf, Greenfield & Sacks, P.C.; James H. Morris; Theodore E. Galanthay (57) ABSTRACT

Process for fabricating a semiconductor non-volatile memory device arranged in rows and columns in a matrix structure, including a first step of forming active area's parallel lines delimited by field oxide lines using a Shallow Trench Isolation process, a second step of forming matrix rows which extend transversally to the active area lines, a third step of forming common source lines alternated between pairs of the matrix rows. The second step includes a first sub-step of forming first lines in a first polysilicon layer, along the active area lines, a second sub-step of forming an intermediate dielectric layer, a third sub-step of forming second lines in a second polysilicon layer for defining the matrix rows, a fourth sub-step of defining the intermediate dielectric layer, a fifth sub-step of etching the first polysilicon lines. The first polysilicon lines have interruptions in regions of the active area lines corresponding to the future common source lines of the matrix, so that, during the fifth etching sub-step, simultaneously with the first polysilicon lines etching, the regions of the active area lines not covered with the first polysilicon lines are etched in order to reduce the difference of level along the common source lines between the regions of the active area lines and the regions of the field oxide lines and consequently to guarantee the electrical continuity of the common source regions of the memory device.

10 Claims, 6 Drawing Sheets

U.S. PATENT DOCUMENTS

| | | | |
|---|---|---|---|
| 5,698,879 | 12/1997 | Aritome et al. | 257/315 |
| 5,753,561 * | 5/1998 | Lee et al. | 438/424 |
| 5,760,436 * | 6/1998 | Chung | 257/314 |
| 5,874,346 * | 2/1999 | Fulford, Jr. et al. | 438/433 |
| 5,915,195 * | 6/1999 | Fulford, Jr. et al. | 438/524 |
| 5,990,527 * | 11/1999 | Wen | 257/391 |
| 6,001,706 * | 12/1999 | Tan et al. | 438/424 |
| 6,060,739 * | 5/2000 | Saitoh | 257/314 |

* cited by examiner

PROCESS FOR FABRICATING A SEMICONDUCTOR NON-VOLATILE MEMORY DEVICE WITH SHALLOW TRENCH ISOLATION (STI)

BACKGROUND OF THE INVENTION

1. Field of the Invention

The present invention relates to a process for fabricating a semiconductor non-volatile memory device, obtained by means of a Shallow Trench Isolation (STI) technique, adapted to guarantee the electrical continuity of the self-aligned source formed by means of a SAS (Self-Aligned Source) process.

2. Discussion of the Related Art

The main features of the STI technology are the elimination of the lateral field oxide (bird's beak), the use of a deposed oxide instead of a thermal oxide, and an excellent oxide planarization over the entire silicon wafer surface. This results in a high scalability of the STI process and makes it suitable, for example, for use in high density Flash memories.

Figure 1:
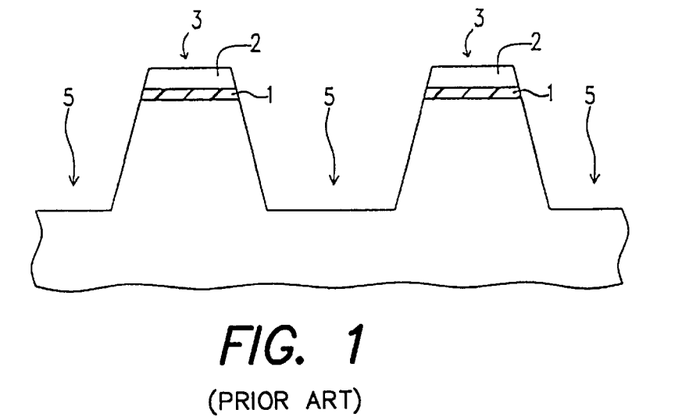
FIGS. 1 to 3 schematically show some main steps of a traditional STI process.
Figure 2:
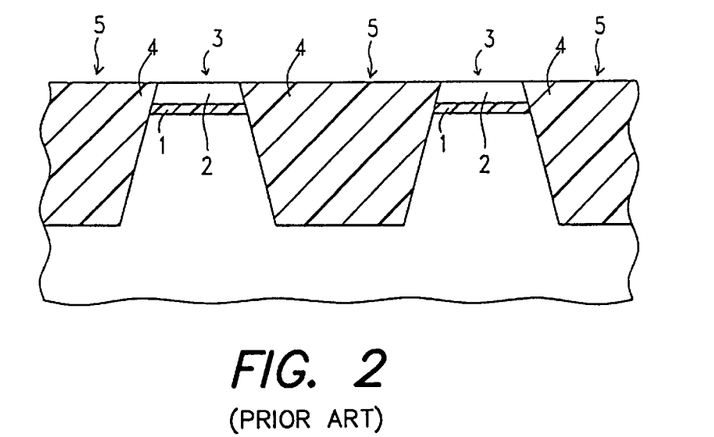
Figure 3:
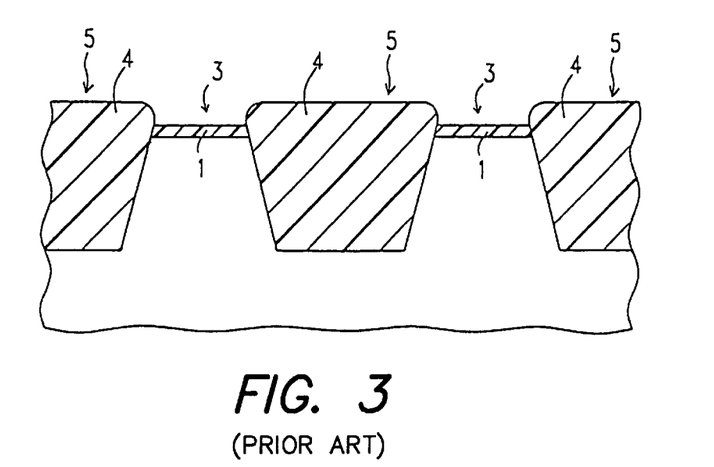

FIGS. 1–3 show some of the main steps of the STI process: FIG. 1 shows the cross-section of a silicon layer after a vertical etching, made using an oxide 1 and nitride 2 mask, in order to form trenches which separate the future silicon active areas 3 from the isolation or field oxide regions 5. Afterwards, a sidewall oxidation at high temperature is used to passivate the etched surface, while obtaining a weak oxide thinning at the corner of the active area (not shown in the Figures).

FIG. 2 shows the same cross-sectional view of FIG. 1, after the step of filling the trenches with oxide 4, a possible selective etching using a counter-mask to reduce the difference in oxide thickness between the active areas 3 and the isolation areas 5, and the subsequent chemical mechanical polishing step which stops on the nitride layer 2 and it provides an excellent planarization of the filling oxide 4 all over the silicon wafer surface.

Finally FIG. 3 shows the same cross section of the device after the removal of the nitride mask 2 by means of a suitable chemical etching.

Figure 4:
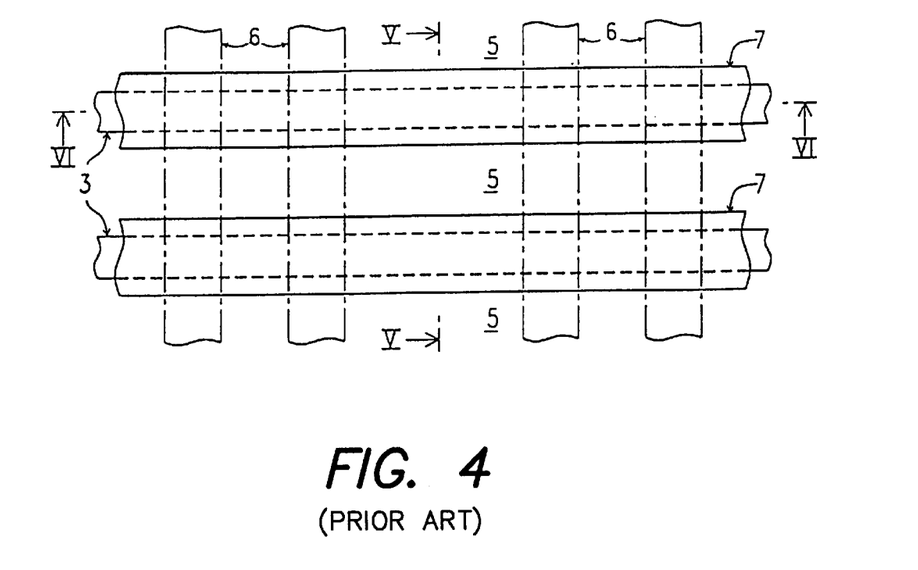
FIG. 4 shows in top-plan view a portion of the matrix of a memory device, at an intermediate step of fabrication according to a traditional STI process.

FIG. 4 shows a top-plan view of a portion of a semiconductor memory device matrix, at an intermediate fabrication step: in particular, after active areas 3 are defined that form parallel lines alternated with isolation regions 5 according to the previously described process (FIGS. 1–3), continuous lines 7 are defined on a first polysilicon layer along the active areas (FIG. 5), by means of deposition and subsequent selective etching. Then an intermediate dielectric layer 9 (for example ONO) is formed over the entire surface and at last other parallel lines 6, defined in a second polysilicon layer and transverse to the active areas 3, are formed by means of deposition and selective etching, these lines 6 corresponding to the future word lines (FIG. 6).

Figure 5:
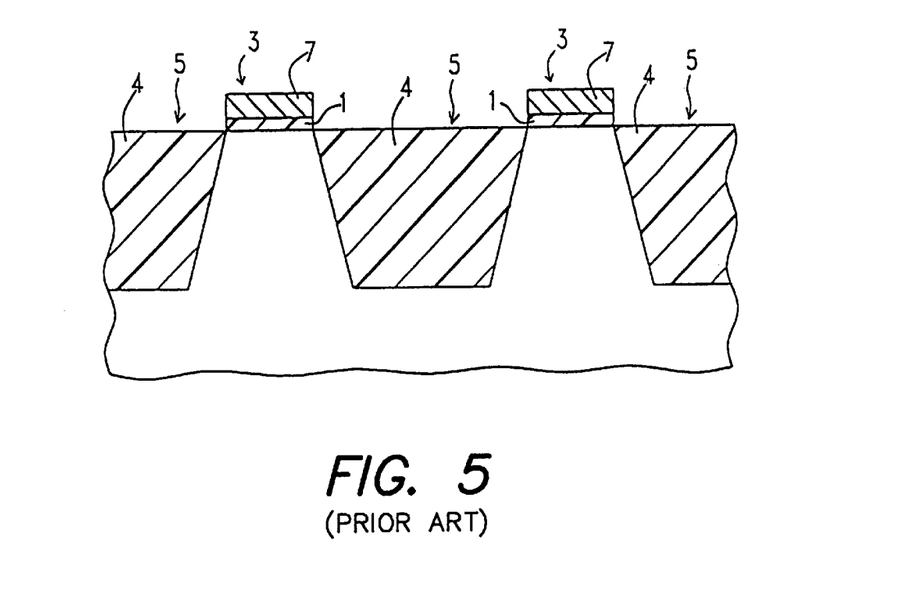
FIG. 5 shows a cross-sectional view taken along line V—V of figure FIG. 4.

FIG. 5 shows a cross sectional view taken along line V—V of FIG. 4, after 2nd poly layer definition and before intermediate dielectric and 1st polysilicon layer definition, that is the cross-section of a matrix's common source line for those memory cells belonging to two contiguous word lines 6. FIG. 5, for clarity, does not show the intermediate dielectric layer 9.

Figure 6:
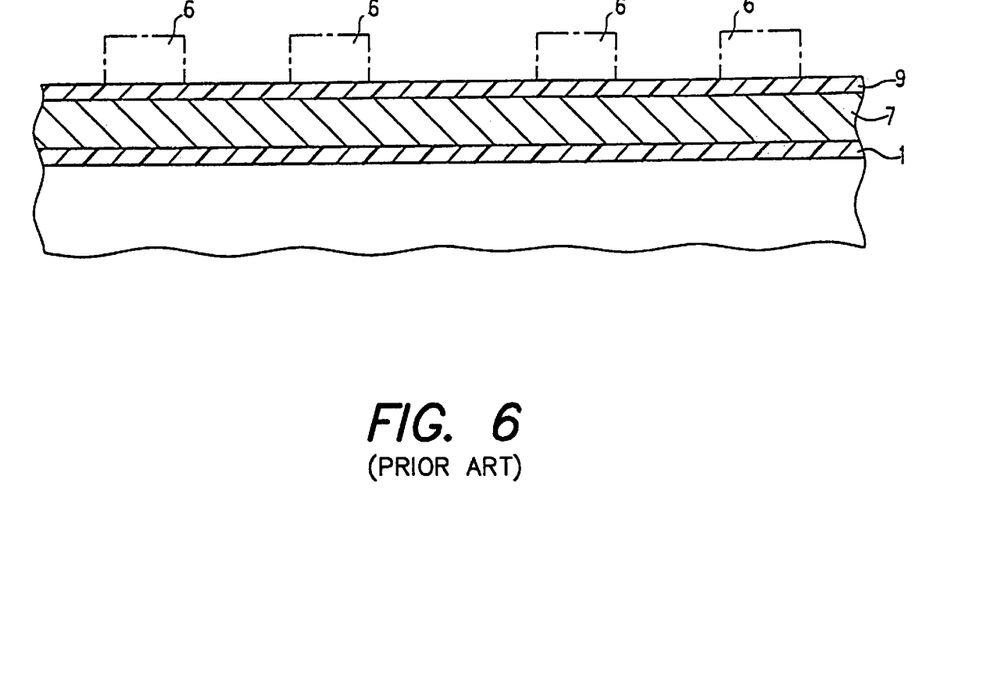
FIG. 6 shows a cross-sectional view taken along line VI—VI of FIG. 4.

FIG. 6 shows a cross-sectional view taken along line VI—VI of an active area's line 3 of FIG. 4.

Figure 7:
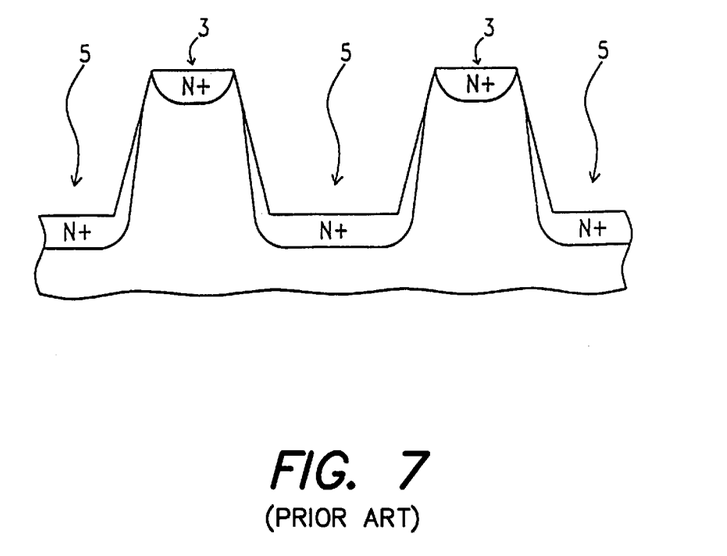
FIG. 7 shows a cross-sectional view taken along a common source line of the memory matrix at the end of the process, after the source implantation.

FIG. 7, similarly to FIG. 5, shows a cross-sectional view of a common source line at the process final step, that is after the source and drain implantation. The electrical continuity of the self-aligned source with STI process, and more in general with completely recessed isolations of the silicon, is a problem due to the different silicon level along the common source line between active areas (high zones) and isolation areas (low zones). In fact, along the common source lines there are differences of level usually of about half a micron, with a submicrometric periodicity (for example 0.7–0.8 µm).

The implantation technology alone is not able to guarantee a perfect connection between the high zones (active areas 3) and the low zones (isolation areas 5) of the silicon, as shown in FIG. 7. Moreover, the use of the titanium salicide along the common source line in order to reduce its resistivity, is not practical without a perfect accordance of the doping depth with the silicon trench walls, in order to avoid the complete consumption of the junction from the salicidation process and the subsequent short-circuit with the substrate.

In view of the state of the art described, it is an object of the present invention to provide a technological process which is able to guarantee the electrical continuity along the common source lines of the matrix of memory cells, even using the STI technique.

SUMMARY OF THE INVENTION

According to the present invention, this and other objects are achieved by a process for fabricating a semiconductor non-volatile memory device arranged in rows and columns in a matrix structure, comprising a first step of forming active area's parallel lines delimited by field oxide lines by means of a Shallow Trench Isolation process, a second step of forming matrix rows which extend transverse to the active area lines, a third step of forming common source lines alternated between pairs of matrix rows, said second step comprising a first sub-step of forming first lines in a first polysilicon layer, along the active area lines, a second sub-step of forming an intermediate dielectric layer, a third sub-step of forming second lines in a second polysilicon layer for defining the matrix rows, a fourth sub-step of defining the intermediate dielectric layer, a fifth sub-step of etching the first polysilicon lines, wherein the first polysilicon lines have interruptions in regions of the active area lines corresponding to the future common source lines of the matrix, so that, during the fifth etching sub-step, simultaneously with the first polysilicon lines etching, the regions of the active area lines not covered with the first polysilicon lines are etched in order to reduce the difference of level along the common source lines between the regions of the active area lines and the regions of the field oxide lines and consequently to guarantee the electrical continuity of the common source regions of the memory device.

BRIEF DESCRIPTION OF THE DRAWINGS

The features and advantages of the present invention will be made clearer by the following detailed description of a particular embodiment thereof, illustrated as a non-limiting example in the annexed drawings, wherein.

DETAILED DESCRIPTION

Figure 8:
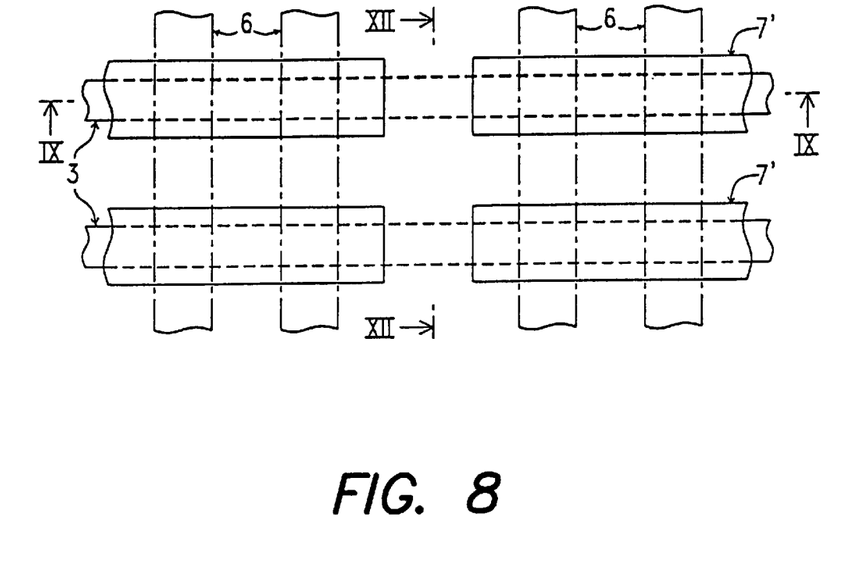
FIG. 8 shows the same top-plan view of FIG. 4, at an intermediate step of fabrication by means of a process according to the present invention.

FIG. 8 shows a top-plan view similar to FIG. 4.

Differently from the conventional process, the process according to the present invention does not form continuous polysilicon lines 7 on the active area lines 3 but polysilicon lines 7' interrupted or segmented over the common source lines: in this way, as described subsequently, the "aspect ratio" between the high zones (active areas 3) and the low zones (isolation areas 5) may be reduced during the definition steps of the word lines 6 in order to guarantee the electrical continuity between the high zones and the low zones of the silicon along the common source lines.

Figure 9:
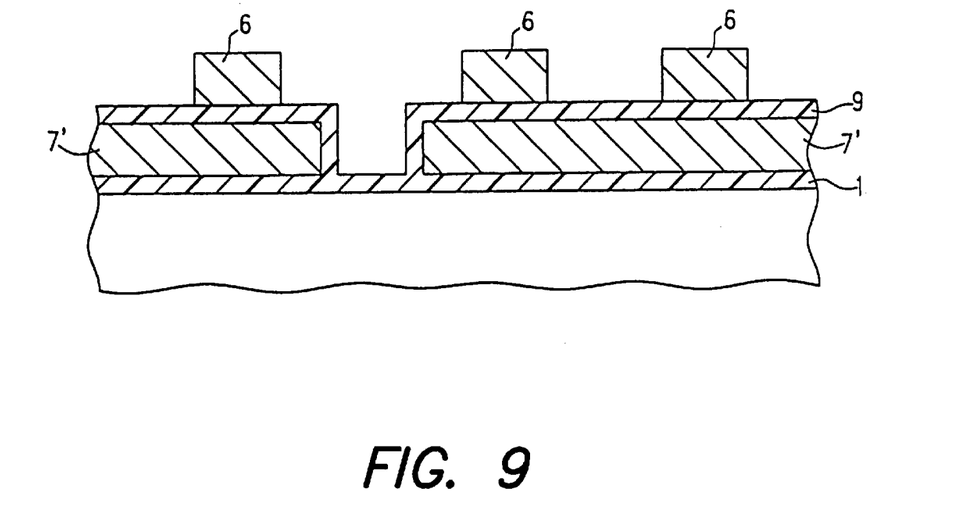
FIGS. 9 to 11 show the cross-section taken along line IX—IX of FIG. 8, in three consecutive steps of the process according to the present invention.
Figure 10:
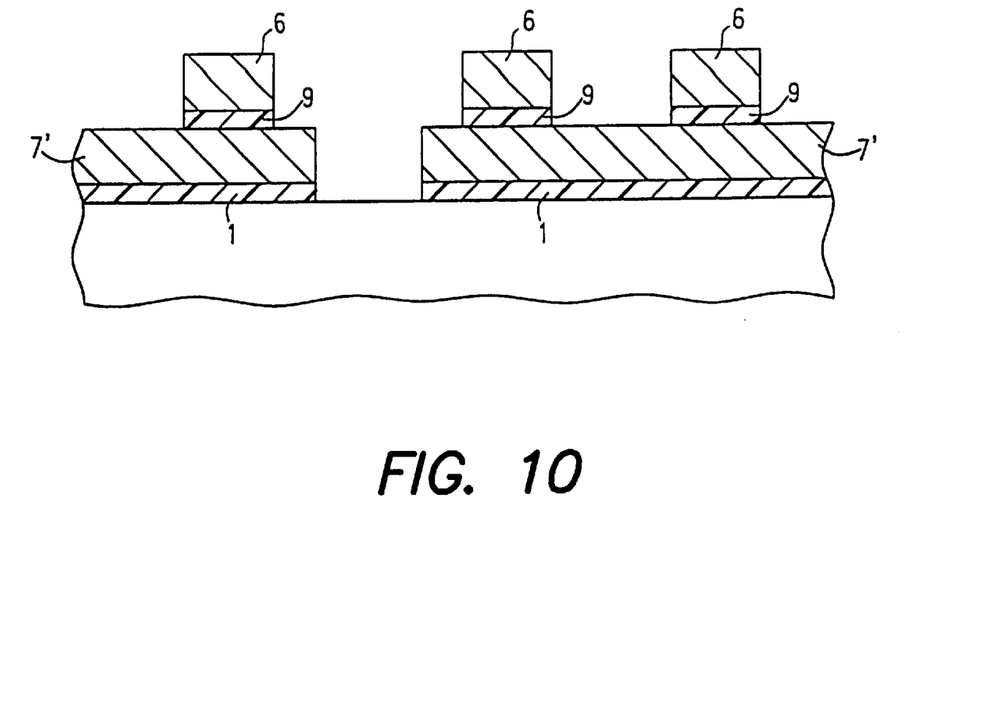
Figure 11:
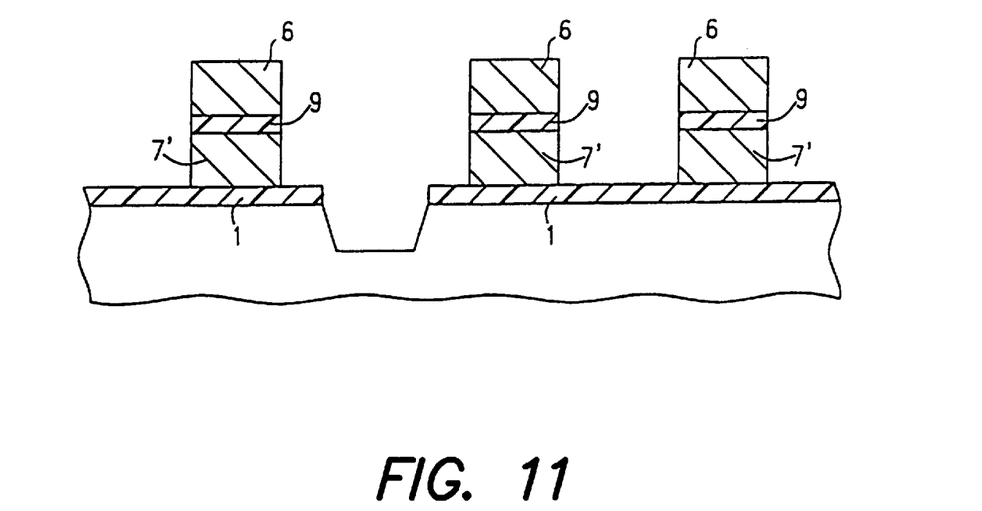

FIGS. 9–11 show the cross-section along line IX—IX of FIG. 8 during some subsequent steps of the process: FIG. 9 shows the cross-section soon after the definition of the upper polysilicon 6 by means of a suitable chemical etching; FIG. 10 shows the same section after etching for the definition of the intermediate dielectric 9 (ONO), where it can be viewed that also the thin oxide gate layer 1 is etched and removed in the zones where the polysilicon line 7' is interrupted, making the silicon active areas 3 uncovered along the future common source line.

The subsequent chemical etching for the formation of the lower polysilicon 7' also affects the silicon active areas 3 which are uncovered along the common source line and it lets the silicon actives zones 3 be reduced for a quantity basically corresponding to the thickness of the lower polysilicon, decreasing the aspect ratio between trench and active area along the only common source line, as shown in FIG. 11.

In this way, for example, the difference of level between the active area and the isolation area may be reduced to about 100–150 nm. The accomplishment of the present invention requires a particular settlement of the process steps of etching ONO and lower polysilicon during the definition step of the gate of the memory cells, without any additional mask.

The reduction of the aspect ratio along the only common source line is adapted to guarantee the electrical continuity along the source line of the matrix, whereas the drain region is not changed at all, since it is covered with polysilicon segments 7'.

Figure 12:
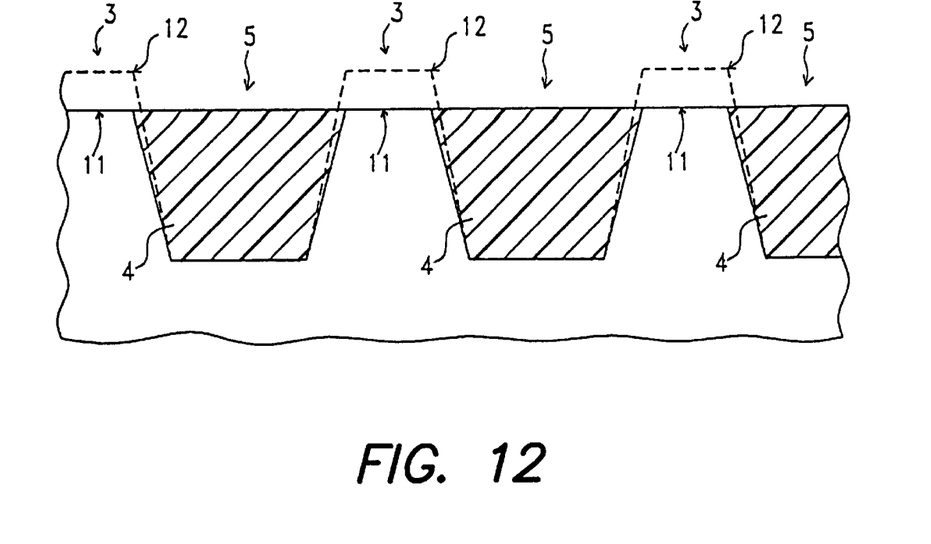
FIG. 12 shows a cross-sectional view taken along line XII—XII of FIG. 8, that is a common source line of the memory device, before the SAS process.

FIG. 12 shows the cross-sectional view taken along line XII—XII of FIG. 8 before the SAS etching for removing the filling oxide 4 along the common source lines. There is shown the new profile 11 of the active zones 3 and also a dotted line representing profile 12 obtained by means of a traditional process.

It is necessary to note that the process according to the present invention does not damage the gate contact with the source in the channel region because, due to this process solution, the silicon area, still covered with the lower polysilicon, remains at the same level of the active area under the gate.

At the end of the gate definition, there is an etching for the formation of self-aligned source lines. The SAS technique is described, for example, in U.S. Pat. No. 5,103,274, which is incorporated herein by reference. A source mask is used to keep the common source lines exposed; by means of a subsequent high-selective etching the filling oxide 4 is removed; an high-dose source implantation of N type dopant is done, eventually a tilted one for doping the trench sidewalls.

Figure 13:
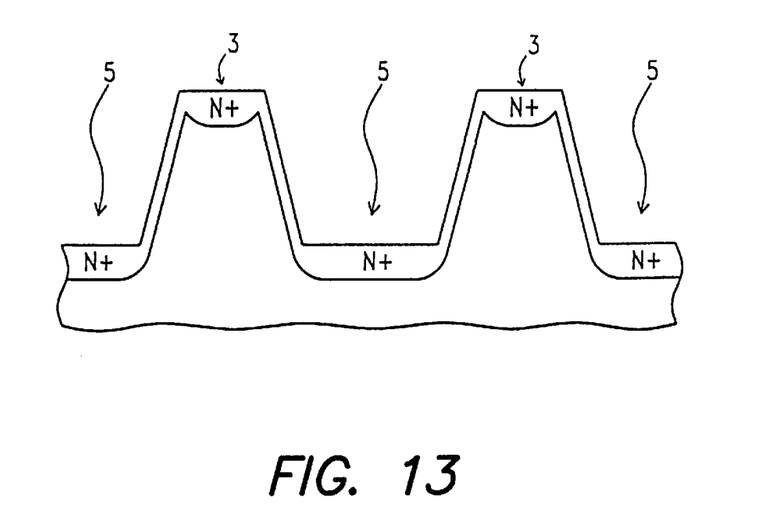
FIG. 13 shows a cross-sectional view taken along a common source line of the matrix of memory cells at the end of the process, after the source implantation, according to the present invention.

As it can be viewed in FIG. 13, due to the reduced aspect ratio, the source implantation guarantees the real formation of an electrically continuous common source line.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Process for fabricating a semiconductor non-volatile memory device arranged in rows and columns in a matrix structure, comprising a first step of forming active area's parallel lines delimited by field oxide lines by means of a Shallow Trench Isolation process, a second step of forming matrix rows which extend transversally to said active area lines, a third step of forming common source lines alternated between pairs of said matrix rows, said second step comprising a first sub-step of forming first lines in a first polysilicon layer, along said active area lines, a second sub-step of forming an intermediate dielectric layer, a third sub-step of forming second lines in a second polysilicon layer for defining said matrix rows, a fourth sub-step of defining said intermediate dielectric layer, a fifth sub-step of etching said first polysilicon lines, characterized in that said first polysilicon lines have interruptions in regions of said active area lines corresponding to the future common source lines of the matrix, so that, during said fifth etching sub-step, simultaneously with said first polysilicon lines etching, the regions of said active area lines not covered with said first polysilicon lines are etched in order to reduce the difference of level along the common source lines between the regions of said active area lines and the regions of said field oxide lines and consequently to guarantee the electrical continuity of the common source regions of the memory device.

2. Process according to claim 1, wherein said third step of forming said common source lines includes the step of providing a Self-Aligned Source (SAS) technique for defining a self-alignment of said common source lines.

3. Process according to claim 2, wherein said third step of forming said common source lines comprises a tilted high-dose dopant ion implantation for doping the trench sidewalls of said field oxide lines.

4. Process according to claim 1, wherein said common source line are N type lines.

5. Process according to claim 1, wherein said third step of forming said common source lines comprises a tilted high-dose dopant ion implantation for doping the trench sidewalls of said field oxide lines.

6. Process according to claim 1, wherein said second sub-step includes forming the intermediate dielectric layer over said first polysilicon layer.

7. Process according to claim 1, wherein the difference of level is about 100–150 nm.

8. Process according to claim 1, wherein the fourth sub-step of defining the intermediate layer includes etching the layer in areas not covered by the second polysilicon.

9. Process according to claim 8, wherein said etching is chemical etching.

10. Process according to claim 8 further forming a thin oxide gate layer etched and removed in the zone where the polysilicon line is interrupted, making the silicon active areas uncovered along the common source line.

\* \* \* \* \*